United States Patent [19]

Hoigaard

[11] Patent Number: 4,649,374
[45] Date of Patent: Mar. 10, 1987

[54] ELECTROSTATIC SYSTEM MONITOR AND METHOD THEREFOR

[75] Inventor: Jan C. Hoigaard, Colorado Springs, Colo.

[73] Assignee: Spectrascan, Inc., Colorado Springs, Colo.

[21] Appl. No.: 568,604

[22] Filed: Jan. 6, 1984

[51] Int. Cl.$^4$ ............................................. G08B 23/00
[52] U.S. Cl. ..................................... 340/573; 128/908; 324/51; 340/649; 340/652; 361/212; 361/220
[58] Field of Search ............... 340/653, 652, 650, 573, 340/649; 324/457, 158 F, 72, 51; 128/695, 696, 128/908; 361/212, 220; 174/556

[56] References Cited

U.S. PATENT DOCUMENTS

| | | | |
|---|---|---|---|
| 2,207,202 | 7/1940 | La Deau | 361/42 X |
| 3,040,211 | 6/1962 | Caldwell | 340/649 X |
| 3,290,668 | 12/1966 | Perretta | 340/649 |

OTHER PUBLICATIONS

Electrical Overstress/Electrostatic Discharge Symposium Proceedings, Orlando, Fla.; "Test Methods for Static Control Products" by J. R. Huntsman et al., Sep., 1982.

ESD Product Description, *Evaluation Engineering*, Oct., 1983, p. 82, last paragraph.

ESD Products, *Evaluation Engineering*, Oct., 1983, p. 88, "Resistance Interval Meter Tests Wrist Straps".

*Primary Examiner*—James L. Rowland
*Assistant Examiner*—Daniel Myer
*Attorney, Agent, or Firm*—Robert C. Dorr

[57] ABSTRACT

An electrostatic system monitor and method for monitoring the operation of static control equipment such as conductive workbench and floor mats, conductive wrist straps, and the integrity of ground connections and soldering irons and to activate indicators and alarms when the static control equipment deteriorates or malfunctions by having resistances outside of predetermined values and ranges of resistance. The electrostatic system monitor also provides for the detection of unsafe voltage potentials on soldering irons, and for a surface resistance probe for measuring the surface conductivity of conductive surfaces of the static control equipment.

24 Claims, 5 Drawing Figures

ELECTROSTATIC SYSTEM MONITOR AND METHOD THEREFOR

DISCUSSION OF THE PRIOR ART

1. Field of the Invention

This invention relates to the field of control of electrostatic discharge, and, more particularly, to the monitoring of static control systems to assure substantial elimination of electrostatic discharge in the manufacturing environment of electronic solid state circuitry.

2. Background of the Art

It is well known that static electricity can cause substantial damage to solid state electronic circuitry. Dry climates generally produce higher static electricity charges than humid climates and, for example, a person walking across a nylon carpet when humidity is 20 percent or less can easily buildup a static electric charge of 30,000 volts. Generally it takes approximately 5,000 volts to generate a spark but only as little as 100 to 500 volts of static electricity to damage sensitive integrated circuits. Even in a high humidity environment, a person walking across a tiled floor may buildup a static voltage of 500 to 2,000 volts. While such a charge is not high enough to cause noticeable electric shocks, it is certainly more than enough to damage sensitive integrated circuits.

The present invention provides a systems approach to the monitoring of conventional static control equipment and the substantial elimination of electrostatic discharge damage to sensitive solid state circuitry, semi-conductors, and integrated circuits. Because of the recent, rapid replacement by metal oxide semi-conductor (MOS) integrated circuits of the older, and less static damage susceptible rugged bi-polar TTL integrated circuits, the problem of electrostatic discharge is now even greater. This is due, in part, to the gate structure of MOS devices and also, in part, to the higher density and smaller physical size of MOS integrated circuitry.

The types of damage caused by electrostatic discharge to integrated circuits constitutes two general areas. The first area of damage occurs when the static discharge physically causes a part or parts of an integrated circuit to become inoperative which will be discovered in manufacturing during quality control testing. The occurrence of this type of damage is costly because it occurs typically after the product is assembled. The second area of damage is even more costly. It has been determined that approximately eighty percent of all electrostatic discharge damage is latent; that is, a part or parts of the integrated circuitry initially gets overstressed due to electrostatic discharge, but would still meet the minimum quality control and test requirements. Such overstressed integrated circuits will, however, always continue to degrade with time and will fail within a relatively short period of time. The costs involved with this type of failure, therefore, are enormous, because it relates to unhappy clients, return of merchandise, increase field service costs and expenses, and the like. It is crucial, therefore, to properly equip work stations with static control equipment and then to monitor the proper operation of this equipment which is provided by the present invention.

To combat such electrostatic discharge damage, work station operators assembling electronic products containing such circuitry are physically grounded by means of conventionally available wrist straps wired to ground to remove the static buildup of electricity within a person's body. Such operators can buildup high electrostatic voltages often in the order of 500 to 30,000 volts. A conductive wrist strap connected to the operator's wrist and then connected to ground minimizes electrostatic discharge damage caused by the work station operator. To further minimize electrostatic discharge damage, it is common practice to use conductive bench and floor mats in the operator's work station area which are also connected to ground. It was common for work station surfaces and storage containers to be made from plastic materials. However, the use of such materials only enhanced the electrostatic discharge damage and, therefore, conductive plastic materials for bench tops, floor mats, and storage containers were developed. Such conductive bench tops and floor mats were grounded to safely discharge any static electricity. The use of such mats and storage containers further insure that the generation of electrostatic discharge will be essentially eliminated. The common ground connection for the entire static control system, should preferably be made to a nearby water pipe or any other suitable earth ground.

Another source of damage in the assembly of such electronic products is the use of an ungrounded or defective soldering iron by the work station operator. A typical ungrounded soldering iron may generate 200 volts AC peak at the tip of the soldering iron and if the iron is SCR-controlled, more voltage can be generated. Soldering irons are now designed to have the tip connected to ground to prevent the generation of such AC voltages.

In the non-assembly environment, various electronic products are now being packaged in conductive plastic packaging material and operators of these electronic products often use static control sprays to reduce the buildup of static discharge. The above described static control techniques are now widely used by the electronics industry and are recognized to result in the dramatic reduction in losses from electrostatic discharge damage. MOS devices now constitute more than 80% of total integrated circuit usage, a fact which also adds to the severity of the problem.

While the above measures have been an important factor in reducing electrostatic discharge damage, there is no general way of verifying the continued integrity of these static control measures. For example, wrist straps, ground wires and soldering irons may become deteriorated and may develop open ground connections due to the constant handling and flexing by the work station operator. When such failures occur, the operator has no ready means of detecting such failure in the equipment. In a typical manufacturing environment containing hundreds of work stations, the probability of one or more of the work stations having such defective equipment is high. When such defective or inoperative static control equipment is allowed to continue in service, without monitoring and repair, substantial damage to equipment and monetary loss can occur.

It is the goal of the present invention to continuously monitor both system earth ground and system electrical ground, monitor the ground connection and the continuity of the wrist strap and the conductive bench and floor mats, and detect any damaging voltage on the tip of the soldering iron. Furthermore, a convenient conductivity test capable of measuring the surface area resistance of the conductive mats and other types of conductive materials is further provided. The cost of the static system monitor of the present invention to provide this continuous monitoring is minimal when compared to the savings caused by preventing damage to the electronic product. Under the teachings of the present invention, any failure or abnormal condition will activate both an audible alarm and clearly marked visual warning lights.

SUMMARY OF THE INVENTION

The present invention concerns an electrostatic system monitor and method for monitoring the operation of various static control equipment in order to assure the substantial elimination of static electricity. Such static control equipment conventionally available includes conductive workbench mats, conductive floor mats, grounded wrist straps over the wrists of users, and grounded soldering irons. The workbench mat, floor mat, and wrist strap are conventionally connected to an earth ground connection such as that of a water pipe.

The electrostatic system monitor of the present invention includes a continuous continuity test circuit for monitoring the low impedance continuity between electrical ground and earth ground. In the event that the impedance increases above a predetermined resistance value, the circuit issues a loss of continuity signal to an indicator and an alarm. The monitor of the present invention also includes a circuit responsive to the periodic manual testing of the conductive wrist strap to determine the resistance of the conductive wrist strap. In the event the resistance is either above or below a predetermined resistance range, a predetermined indicator arrangement is activated. Likewise, the present invention is responsive to the periodic manual testing of the tip of the soldering iron to detect whether the induced AC voltage on the tip of the soldering iron exceeds a predetermined AC voltage and, if so, a suitable indicator and alarm is activated. The present invention also includes a surface resistance probe for detecting the surface resistance of the conductive workbench mat and floor mat or any other conductive surface. When the surface resistance of the conductive surface is either greater than or less than a predetermined adequate conductivity, a prearranged pattern of indicators and alarms are also activated.

In this fashion, the electrostatic system monitor of the present invention provides a simple and effective monitor of conventionally available static control equipment to ascertain that the equipment is functioning properly. A central monitor is provided for supervising a number of electrostatic system monitors at workstations in a manufacturing environment.

GENERAL DESCRIPTION

In the following, the various functions of the electrostatic system monitor of the present invention will be discussed and includes: a ground continuity test, a wrist strap test, a conductivity test, and a soldering iron test.

1. Ground Continuity Test

Figure 1:
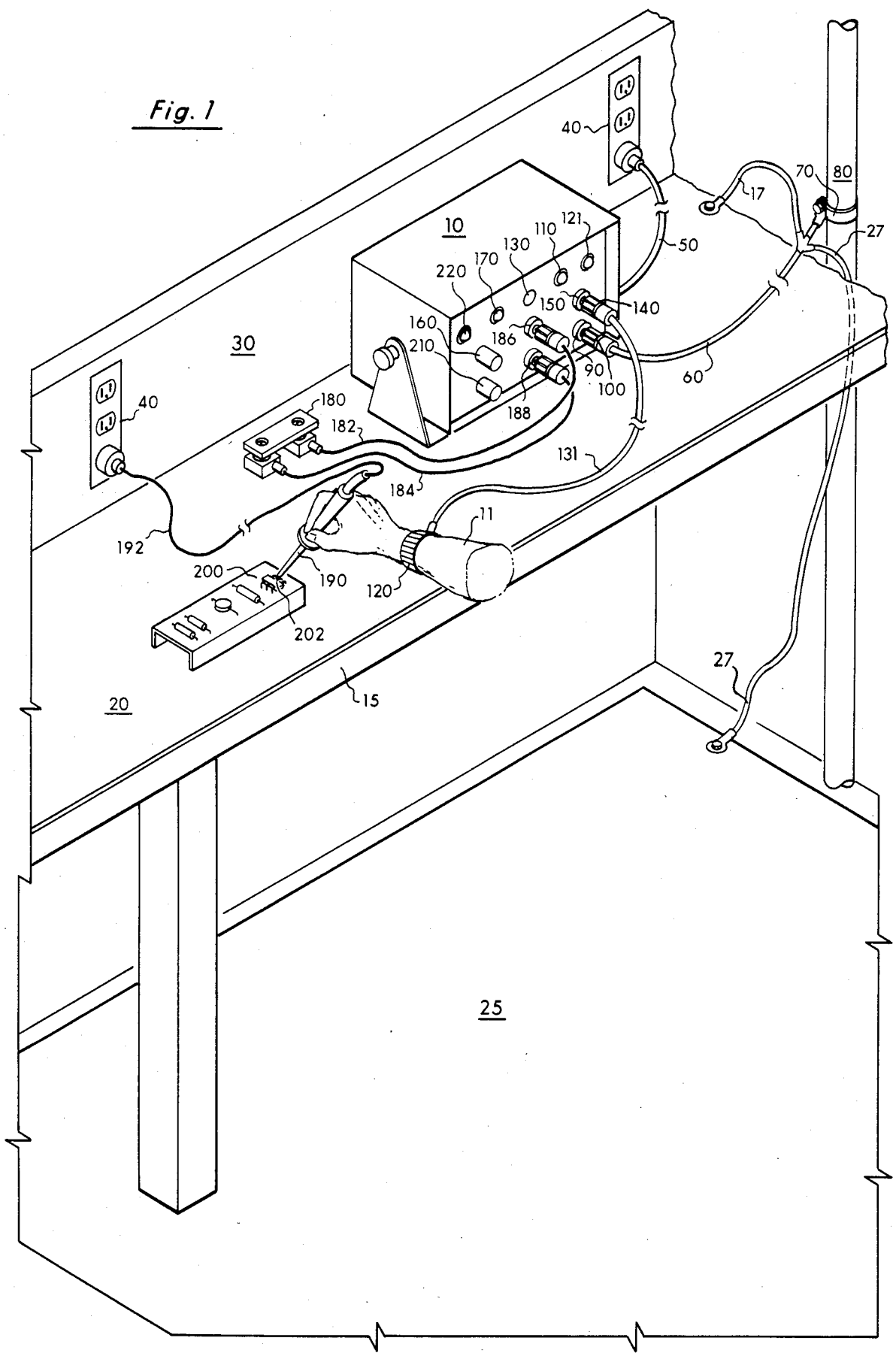
FIG. 1 sets forth a work station utilizing the electrostatic system monitor of the present invention, FIG. 2 sets forth a block diagram arrangement showing a plurality of electrostatic system monitors interconnected with a single central monitor station, FIG. 3 sets forth the electronic circuitry for the electrostatic system monitor of the present invention.

In FIG. 1 is set forth the electrostatic system monitor 10 of the present invention as set up on a manufacturing static control workbend location. The electrostatic system monitor 10 is located on a conductive workbench 15 having a backing 30 containing electrical conduit and electrical outlets 40. A conductive bench mat 20 and a conductive floor mat 25 are provided. Conductive bench mat 20 is grounded over wire 17 and conductive floor mat 25 is grounded over wire 27. The electrostatic system monitor 10 of the present invention obtains its AC power and electrical ground over cord 50 which is plugged into one of the outlets 40 on the utility backing 30. The electrostatic system monitor 10 of the present invention also receives earth ground over cable 60 which is connected to a conventional clamp 70 on water pipe 80. Cable 60 is preferably fourteen to eighteen gauge wire which is run to the nearest water pipe 80. The remaining end of cable 60 is connected to an earth ground terminal 90 by means of an opposing electrical mating connector 100. As noted, water pipe ground wire 60 also connects to wires 17 and 27 for grounding of conductive mats 20 and 25. Both wires 17 and 27 must be grounded to the common ground from water pipe 80. This may be accomplished by splicing wire 17 and 27 to wire 60, as shown, which is then connected to water pipe 80, or by connecting wires 17 and 27 to the "binding post" terminal 90, which can accept several wires.

With the electrostatic system monitor of the present invention 10 receiving power over cable 50, the system will continuously monitor for low impedance continuity between the earth ground provided by the water pipe 80 and the electrical ground provided by the electrical outlet 40. If the resistance between the two grounds is less than a predetermined value such as approximately 100 ohms, a "GROUND OK" light 110 is turned on. If the resistance exceeds the predetermined value of low impedance, light 110 goes out and audible alarm 130 sounds.

2. Wrist Strap Test

In another aspect of the present invention, the human operator 11 located at the work station and who might be charged with electrostatic electricity, wears a conductive wrist strap 120, strapped onto the wrist and interconnected over cable 131 to the electrostatic system monitor 10 of the present invention. Cable 131 has a connector 140 which mates with connector 150 on monitor 10. Interconnecting cable 131 provides earth ground to the wrist of the person 11 and effectively discharges any electrostatic electricity contained on the human operator 11.

Furthermore, the present invention will determine whether the wrist strap 120 has proper resistance by one of two approaches. First, the operator touches the wrist strap 120 which is conductive by making contact with the wrist strap test terminal 160. The "Strap/Conductivity" test indicator 170 will become activated if the wrist strap 120 has a safe resistance in a predetermined strap resistance range of more than approximately 200 kilohms, but less than approximately 2.5 Megohms. In other words, the safe strap resistance operating range of the preferred embodiment is between 200 Kilohms and 2.5 Megohms. However, if the wrist strap 120 is open or has deteriorated to a resistance of more than 3.0 Megohms, then the visual indicator 170 will remain off. On the other hand, if the wrist strap 120 is shorted or has deteriorated to less than 150 Kilohms, the audible alarm will sound, while the indicator stays on. This signaling process is summarized as follows:

TABLE 1

| Resistance Range | Indicator 170 Status | Audible Alarm 130 |
|---|---|---|
| 0–150 Kilohms | On | On |
| 200 Kilohms–2.5 Megohms | On | Off |
| 3.0 Megohms to Open | Off | Off |

Under the second method, the wrist strap 120, attached to the person 11 is plugged into test terminal 160 and the person can now touch the conductive benchtop mat 20 with the palm of his or her hand. Indicator 170 will be activated to indicate that both the wrist strap 120 and the benchtop mat 20 are conducting and properly grounded. The conductive floor mat 25 may also be tested in the same manner by placing the palm of the hand on the floor mat 25. Under this second method, if the "Strap/Conductivity" test indicator 170 fails to become activated then the wrist strap 120 may be defective and should be tested according to the procedure set forth above. If the wrist strap 120 passes, then the ground wires 17 and 27 for the conductive bench mat 20 or the floor mat 25 may be broken, disconnected or deteriorated and they should be checked and repaired if necessary. If the ground wires 17 and 27 are fully operative, then the resistance of mats 20 and 25 may have deteriorated and should be checked with the conductivity test as set forth in the next section. This test may also be conducted with the wrist strap 120 plugged into terminal 186 for equipment where mats 20 and 25 have very high resistance—in excess of the sensitivity of the wrist strap input. With the wrist strap 120, plugged in to terminal 186, normally used with surface resistance probe 180 described below, a total resistance of up to 1000 Megohms may be measured, whereas terminal 160 is limited to 2.5 Megohms.

It can be observed that the electrostatic system monitor 10 of the present invention enables the user 11 to periodically ascertain the integrity of his or her wrist strap 120, the integrity of the bench conductive mat 20 and floor conductive mat 25, or other static control equipment. In operation this should be done several times a day such as just after starting work, each break, and after lunch.

3. Conductivity Test

The electrostatic system monitor 10 of the present invention is also able to quickly measure the conductivity of the workbench mat 20 and the floor mat 25. It can also be used to ascertain the conductivity of other items such as conductive tote boxes, bags, seat covers and lab coats.

A surface resistance probe 180 is provided which is interconnected over cables 182 and 184 to conductivity test terminals 186 and 188 respectively. Suitable mating connectors are provided on opposing ends of cables 182 and 184. The surface resistance probe 180, as will be discussed in greater detail subsequently, contains two one inch steel cubes designed to measure surface resistance. In operation, when the surface resistance probe 180 is interconnected to the electrostatic system monitor 10 of the present invention over cables 182 and 184, the probe 180 measures surface resistance. "Adequate Conductivity" is a term defined herein to mean less than 1000 Megohms per square inch surface resistance. That amount of conductivity is adequate for the mats and other conductive surfaces and the user 11 is assured that proper electrostatic discharge conditions are being met. With adequate conductivity, the "Strap/Conductivity" Test indicator 170 will become activated and the audible alarm 130 will sound to both visually and audibly indicate that the surface has, in fact, adequate conductivity. If the conductivity of the surface is between approximately 1000 and 3000 Megohms per square inch surface resistance, only the visual indicator 170 will become activated. Finally, for surface conductivities of greater than approximately 3000 Megohms per square inch surface resistance, neither the visual indicator 170 nor the audible alarm 130 will be activated. This is summarized below:

Table 2

| Surface Resistance | Visual Indicator 170 | Audible Indicator 130 |
|---|---|---|
| 0–1000 Megohms | On | On |
| 1000–3000 Megohms | On | Off |
| Greater Than 3000 Megohms | Off | Off |

In conclusion, the present invention provides an additional probe 180 for quickly ascertaining whether or not the conductive mats 20 and 25 or other conductive items in the work station environment have adequate conductivity to be effective.

In another embodiment of the present invention, the indicator 170 only will remain on for resistances ranging from approximately 100 Kilohms (or any other set limit) to 1000–3000 Megohms, while materials with less than 100 Kilohms (or other set limit), considered too conductive for controlled discharge of electrostatic charges, will activate both indicator LED 170 and alarm 130. The advantage of this embodiment, is that an alarm signal always indicates a failure or dangerous condition.

4. Soldering Iron Test

FIG. 1 further illustrates a grounded soldering iron 190 which is connected over electrical cord 192 to a conventional outlet 40. The user 11 uses the grounded soldering iron 190 on a typical work piece 200. If the tip 202 of the soldering iron 190 become ungrounded, either due to corrosion or due to a broken ground wire, a high AC voltage may be induced in the tip 202 from the field surrounding the heating element. It is to be noted that SCR controlled soldering irons are especially susceptible to this type of problem. Indeed, voltage spikes of several hundred volts are not uncommon and such voltages destroy electrostatic sensitive work pieces 200 such as those that include PMOS and CMOS circuitry. Under the teachings of the present invention, the electrostatic system monitor 10 of the present invention will test the soldering iron 190 for the presence or absence of AC voltage or transient spikes on the tip 202. The user 11 periodically manually touches the tip 202 of the iron 190 to terminal 210. If AC voltage or transient spikes exceed approximately five volts RMS or seven volts peak, or any other preset voltage, into an approximately 30 Megohms, or any other, specified load, then the tip 202 and the iron 190 is defective and should not be used. If this occurs, an indicator 220 is visually activated and the audible alarm 130 will sound. A safe soldering iron 190 with a properly grounded tip 202 will not activate either the visual indicator 220 or the audible alarm 130.

Therefore, in use and operation, the user 11 periodically touches the tip 202 of his or her soldering iron 190 to terminal 210. This touching should occur several times a day as, for example, when the worker starts up at the work station and after each break period.

While the above represents tests on conventional static control equipment such as mats, wrist straps, and soldering irons, the teachings of the present invention can be applied to one or a plurality of the above tests as well as tests for heel straps, conductive containers and the like to monitor their performance.

5. Central Monitor

Figure 2:
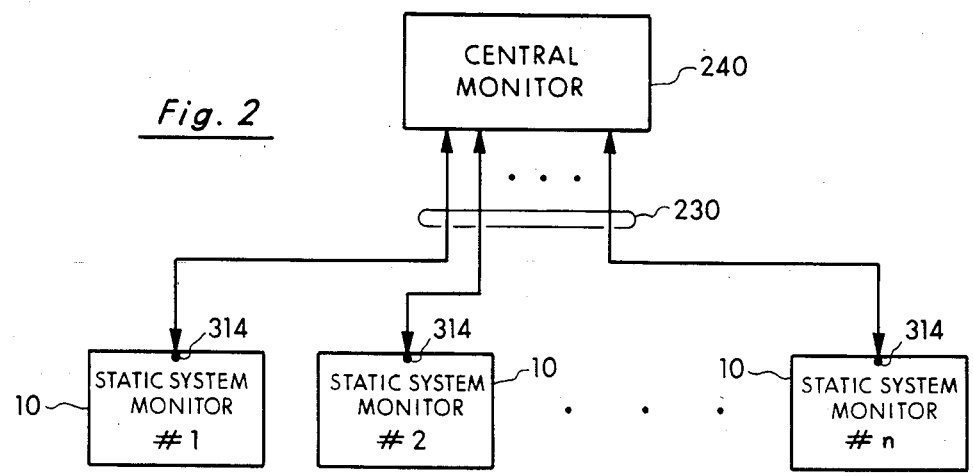

As shown in FIG. 2, a number of electrostatic system monitors 10 of the present invention can be interconnected over cables 230 to a central monitor 240. Each electrostatic system monitor 10 contains a remote control output which is connected to cable 230 into the central monitor. In this fashion, the central monitor can monitor the operation of each electrostatic system monitor 10. The electrostatic system monitor 10 normally provides a low current output of zero volts to its line for normal operation and twelve volts DC over that same line for an alarm indication. It is contemplated that the central monitor 240 can contain circuitry to monitor up to one hundred static system monitors, 10, and therefore one hundred work stations. Additional static system monitors, or work stations, can be monitored by using additional central monitors.

DETAILED CIRCUIT DESCRIPTION

Figure 3:
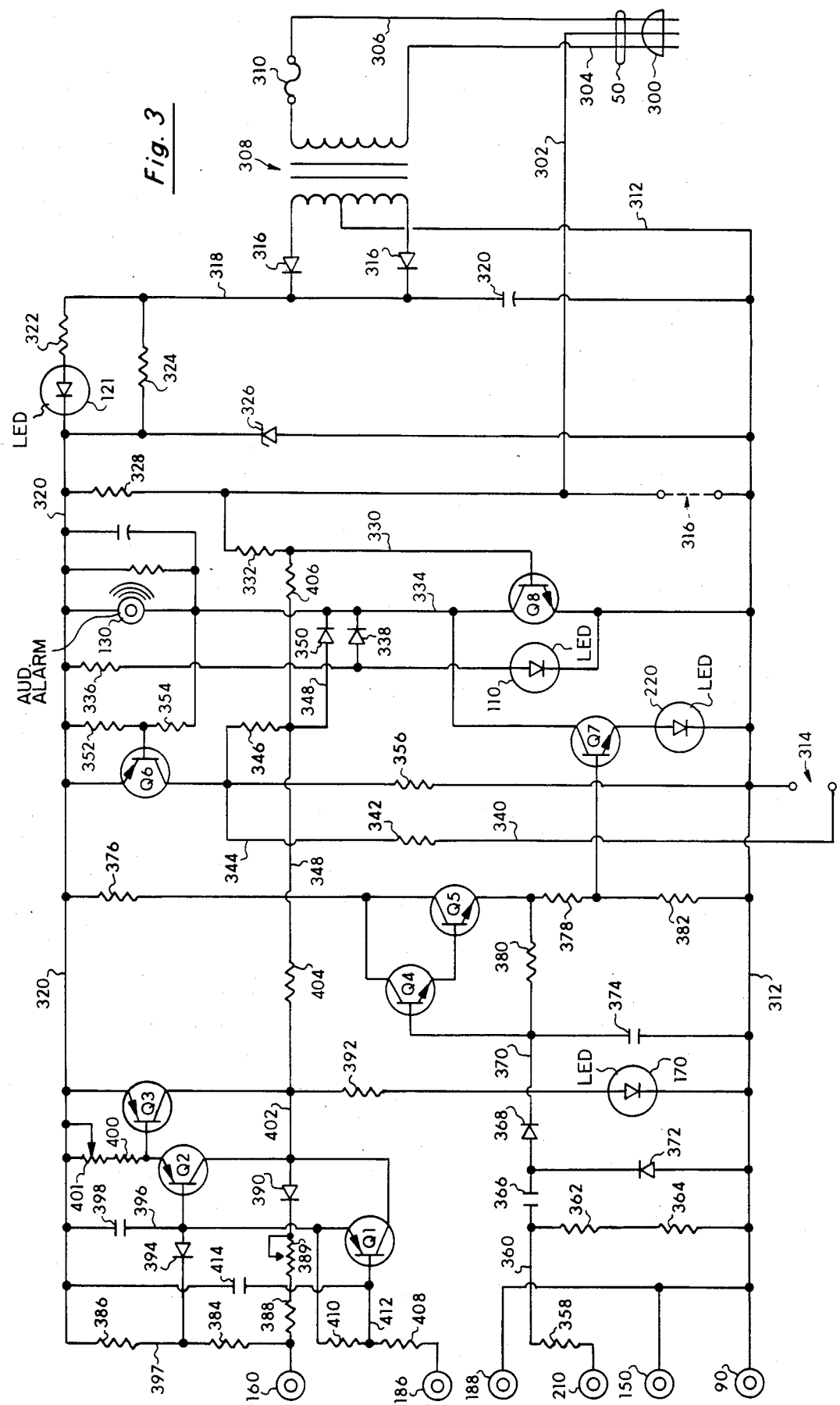

In FIG. 3, the electronic schematic for the circuitry contained within static system monitor 10 is set forth. Power is delivered into the circuitry over cable 50 when plug 300 is plugged into electrical outlet 40. Electrical ground appears on line 302 and alternating current power is delivered over lines 304 and 306. The power on lines 304 and 306 accesses transformer 308 and power over line 306 is delivered through a protective fuse 310. The secondary of transformer 308 has a center tap which is connected to ground line 312 and to connector 90 which is the earth ground connector. Hence, and with reference back to FIG. 1, earth ground is delivered by means of cable 60 from a water pipe 80 into connector 90 and to line 312 which provides earth ground and the ground connection for the circuitry shown in FIG. 3. Line 312 is also delivered into the wrist strap connector 150 for delivery through interconnecting cable 131 to the wrist strap 120 of user 11. Hence, earth ground is also provided to the wrist strap 120 over line 312 and is further provided to connector 188 which is the ground connection over cable 184 to the surfaces resistance probe 180. Earth ground appearing on line 312 is also delivered into connector 314 which is the connector shown in FIG. 2 for connection to the central monitor 240. Hence, the central monitor 240 also receives earth ground. As can be appreciated, the use of earth ground is important in minimizing the effects of static electricity.

At this point, it should be pointed out that if a customer prefers electrical ground to earth ground the present invention can optionally provide electrical ground to line 312 in the following fashion. An optional connection 316 is inserted to provide a conducting path between line 302 and line 312. In this arrangement, cable 60 is not plugged into connector 90 and with connection 316 in place, electrical ground is provided over line 312. It is to be expressly understood that this is an optional approach and that either connection 316 for electrical ground or cable 60, connected to a water pipe 80, for earth ground may be used.

Returning to the output of the secondary of transformer 308, the secondary accesses two diodes to provide full wave rectification and to provide approximately fifteen volt DC output. In the preferred embodiment, diodes 316 are conventionally available as models 1N4003. The full wave rectified output is delivered over lines 318 and is delivered to filter capacitor 320, connected to earth ground 312, and is also delivered through resistor 322 to a visual indicator 121. In the preferred embodiment, capacitor 320 is a 470 microfarad capacitor and resistor 322 is 150 ohms. The visual indicator 121 is a conventional light emitting diode (LED). Across LED 121 and resistor 322 is connected in parallel a resistor 324 having one end connected to line 318 and its second end connected to line 320. Resistor 324 preferably is 120 ohms. Line 320 is connected to Zener diode 326, preferably 1N4742A, which has its other end connected at earth ground 312.

Essentially the circuit involving the transformer 308, the diodes 316, Zener diode 326, resistors 322 and 324, and LED 121 function to provide a regulated twelve volt DC level on line 320. It is to be expressly understood that other power supply circuits can be designed to provide the same type of regulated voltage on line 320 as herein disclosed. As long as power is provided to the circuit the light 121 is activated.

1. Ground Continuity Circuit

The ground continuity function, as previously discussed, permits a continuous measurement of the quality of both the earth ground appearing on line 312 and the electrical ground appearing on line 302. This is accomplished as follows. The twelve volts DC appearing on line 320 is delivered through resistor 328 to electrical ground on line 302. Resistor 328 is preferably 3.6 kilohms. resistor. The base of transistor Q8, connected to line 330, is delivered through resistor 332 which has its other end connected at electrical ground 302. The emitter of Q8 is connected to earth ground appearing on line 312. The collector of transistor Q8 is connected to line 334 which is in turn connected to alarm 130 and the other side of alarm 130 is connected to the twelve volts DC on line 320. In addition, the GROUND OK light 110 has one end connected to earth ground on line 312 and its opposing end connected through resistor 336 to power on line 320 and is further connected through diode 338 to line 334. In the preferred embodiment, transistor Q8 is a Model No. 2N3904 which is conventionally available, visual indicator 110 is a light emitting diode, resistor 336 is 620 ohms, and diode 338 is conventionally available as Model No. 1N4146.

Transistor Q8 essentially measures the resistance difference between the earth ground on line 312 and the electrical ground on line 302. For example, as the resistance between earth ground on 312 and electrical ground on 302 increases, a voltage divider occurs between resistor 328 and resistor 332 and this ground resistance thereby causing more current to be delivered through resistor 332 and to turn on transistor Q8. As transistor Q8 turns on, the potential on line 334 moves towards line 312, which is also earth ground.

Now, as long as there is no ground resistance being developed, transistor Q8 is off and indicator 110 is continually lit by delivering current through resistor 336.

Hence, as long as the grounds are properly functioning, the indicator light 110 is always on. However, if a resistance develops between earth ground and electrical ground, an electrical signal is issued by the circuit when transistor Q8 turns on and, in the preferred embodiment, it will turn on when the resistance increases above the predetermined value, 100 ohms, or should either earth ground or electrical ground become open circuited. When Q8 turns on under these conditions, the voltage on line 334 moves towards ground on line 312 causing diode 338 to turn on and short circuiting or turning off indicator light 110. This also increases the voltage across the alarm 130 which then becomes activated. Hence, when the total resistance between the two grounds becomes greater than 100 ohms, or either ground becomes open circuited, indicator light 110 turns off and alarm 130 turns on.

It is to be expressly understood that in the preferred embodiment the turn on point is approximately 100 ohms but this can be varied by altering the values for resistors 328 and 332.

Transistor Q6 provides snap action hystersis for transistor Q8 so that both the alarm 130 and the indicator 110 turn on and off abruptly and distinctly rather than gradually. Transistor Q6 has its emitter connected to the DC power on line 320 and has its base connected through resistor 352 to DC power 320 and its base is further connected through resistor 354 to line 334. The collector of transistor Q6 is connected to line 344 and is further connected through resistor 356 to earth ground on 312. In the preferred embodiment, transistor Q6 is a conventional Model 2N3906 transistor, resistor 352 is 3.3 Kilohms, resistor 354 is 15 Kilohms, and resistor 356 is 10 Kilohms. In operation, as transistor Q8 turns on and as the potential on line 334 moves towards ground, the voltage across resistor 354 increases to deliver more current to the base of Q6 thereby rapidly turning on Q6 which provides more voltage to line 344. This sends a current through resistors 346 and 406, (56 Kilohm and 1.5 Kilohm) into the base of Q8, thereby accellerating the turn-on of Q8. With Q8 and Q6 on, the twelve volts on Line 320, sends a current through resistor 342 to the output jack 314. Hence, in an alarm condition, the twelve volt signal is delivered to the central monitor 240 and in normal conditions, ground is essentially applied.

In summary, the ground integrity is monitored continuously and in the event of any resistance changes or open circuits in the earth or electrical grounds, the system rapidly functions to sound an alarm 130, to send that signal to a central monitor 240 and to extinguish indicator light 110.

2. Soldering Iron Test Circuit

As previously discussed, the soldering iron function permits the testing of the soldering iron 190 to ascertain that it is free of any damaging voltage on the tip 202 due to bad grounding, broken wires, corrosion or other defects. The circuitry to be described prevents such damage by measuring the actual voltage on the tip 203 when the tip 202 is touched to connector 210. If voltage on the tip 202 is greater than a predetermined voltage, such as five volts RMS or seven volts peak into a load of approximately thirty Megohms, the indicator 220 will become activated and the alarm 130 will sound. A safe iron tip 202 maintains the audible alarm 130 and the visual indicator 220 in an off state.

In operation, any induced AC signal on the iron tip 202 is delivered into terminal 210 and further delivered through resistor 358 into line 360. Line 360 is connected through resistor 362 and 364 to earth ground 312 and line 360 is further connected through capacitor 366 and diode 368 to capacitor 374 and line 370; the other end of capacitor 374 is connected to ground 312. In the preferred embodiment, resistors 358, 362, and 364 are each ten Megohms and the three resistances combine to an input load of 30 Megohms. Capacitor 366 and 374 are 0.01 microfarads and diode 368 is preferably a Model No. 1N4148.

Between capacitor 336 and diode 368 is another diode 372 which is connected to ground 312. The diode, 372, is preferably Model No. 1N4148. Capacitors 366 and 374 and diodes 368 and 372 act as a voltage doubling rectifier to rectify the AC voltage appearing on line 360 and placing the recitified D.C. voltage on line 370. Resistors 358, 362, and 364, totaling 30 Megohms, must be a high impedance because the induced voltage, appearing on the tip 202 of the iron 190 would be severely reduced by a low impedance load. The rectified and doubled input voltage appearing on line 370 is then delivered to the base of transistor Q4 which has its emitter coupled to the base of transistor Q5. The collectors of transistor Q4 and Q5 are tied together and are delivered through resistor 376 to power on line 320. The emitter of transistor Q5 is delivered through resistor 378 to the base of transistor Q7. In the preferred embodiment, transistors Q4 and Q5 are conventionally available as Model Nos. 2N3904 and are interconnected as a current amplifier. Resistor 380 is connected in parallel across the base input to transistor Q4 and the emitter output of transistor Q5. The output of resistor 378 is delivered through resistor 382 to earth ground on 312 and, as mentioned, is delivered into the base of transistor Q7. In the preferred embodiment, resistor 376 is one Kilohm, resistor 378 is 2.2 Kilohms, resistor 380 is ten Megohms, resistor 382 is one Megohm and transistor Q7 is conventionally available as Model No. 2N3904. The collector of transistor Q7 is tied back to previously discussed line 334 and the emitter of transistor Q7 is delivered through a light emitting diode 220 to earth ground 312.

This circuit functions as follows. An AC signal appearing on connector 210 is delivered into a high impedance load and then the portion of this AC voltage appearing on line 360 is rectified and doubled when it reaches line 370. At this point, the AC signal has been rectified into a direct current voltage delivered into the base of Q4. The rectified signal is further amplified, and the gain is determined in part by the values of resistors 378, 380 and 382 to turn on transistor Q7 if the AC voltage on connector 210 exceeds five volts RMS or seven volts AC peak. To summarize, when Q4 turns on, Q5 turns on and an amplified signal is delivered into the base of transistor Q7. In the preferred embodiment, approximately 2.7 volts at the base is required to turn on transistor Q7. With transistor Q7 turned on, light emitting diode 220 becomes activated and turns on. Furthermore, the turning on of transistor Q7, as with the turning on of transistor Q8, moves the potential on line 334 toward ground, to a potential of approximately two volts and thereby activating the alarm 130. Since the voltage on Line 334 does not decrease below two volts, LED 110 will not be turned off, even though alarm 130 is activated. In a similar fashion, and as previously discussed, transistors Q6 and Q8 provides hystersis to quickly turn on and off the alarm and to provide a twelve volt signal on jack 314 for delivery to the central monitor 240.

It can be readily observed that the soldering iron test shares circuitry with the continuous ground monitor circuit. Again, the aforesaid preferred values for the components can be modified to provide for greater or lesser sensitivity to the induced voltage appearing on the tip 202 of the iron 190, and delivered to terminal 210.

3. Wrist Strap Circuit

As previously discussed, the wrist strap 120 is periodically manually touched to connector 160 by the user. Table 1 sets forth the three conditions for the wrist strap test. Terminal 160 is connected through resistor 384 to line 397. Line 397 connects to power on line 320 through resistor 386 and to line 396 through diode 394. Line 396 connects to the base of transistor Q2, to one end of capacitor 398, to the emitter of transistor Q1 and to one end of resistor 410. Terminal 160 is also connected through resistor 388, through trim-potentiometer 389 and through diode 390 to the collectors of transistors Q1, Q2 and Q3 and through resistor 392 and light-emitting diode indicator 170 to earth ground 312. In the preferred embodiment, resistor 384 is 1.5 Megohms, resistor 386 is 680 Kilohms, resistor 388 is 62 Kilohms, trim-potentiometer 389 is 50 Kilohms, diodes 390 and 394 are Model Nos. 1N4148, capacitor 398 is 0.1 microfarad and resistor 392 is 510 ohms. Because of this voltage-dividing arrangement, the terminal 160 normally sits at twelve volts DC. Hence, it can be observed through reference to Table 1, that depending upon the resistance from connector 160 through the wrist strap 120 through cable 131 to ground at terminal 150 the voltage level at terminal 160 can significantly vary. For example, if the wrist strap 120 functions properly, then the resistance which will be encountered between terminal 150 and terminal 160 is between 200 Kilohms and 2.5 Megohms. When this occurs, a voltage drop range of less than twelve volts must occur across resistors 384 and 386. Line 397 must drop below approximately ten volts to turn on diode 394, which will turn on transistors Q2 and Q3 and activate LED 170. In the preferred embodiment, transistors Q2 and Q3 are conventionally available as Model Nos. 2N5086. The diode 394 acts as a level triggered switch to turn on when the voltage at line 397 drops below approximately ten volts.

The emitter of transistor Q2 is connected through resistor 400 and trim-potentiometer 401 to power on line 320 and the emitter is further connected to the base of transistor Q3. The outputs of transistors Q1, Q2 and Q3 and tied together on line 402 which are delivered into resistor 404. Resistor 404 is in turn connected to line 348 and is delivered through resistor 406 to line 330 at the base of transistor Q8. As previously mentioned, line 402 is further connected back through diode 390, trim-potentiometer 389 and resistor 388 to terminal 160. In the preferred embodiment, resistor 400 is 2.0 Kilohms, trim-potentiometer 401 is 25 Kilohms, resistor 404 is 4.7 Kilohms and resistor 406 is 1.5 Kilohms. Trim-potentiometers 401 and 389 enable setting the specified test levels more precisely than fixed resistors and may be substituted with resistors which are selected in production test.

The wrist strap circuit functions as follows and with specific reference back to Table 1. When the wrist strap 120 is touched to the terminal 160 and the safe resistance range of 200 Kilohms to 2.5 Megohms is measured, only the indicator light 170 is activated, since line 402 will rise only until diode 390 turns on, at which point it will attempt to turn transistor Q2 off. Equilibrium is reached at this point, and the resistance between terminals 160 and 150 must decrease below 150 Kilohms for line 402 to rise in voltage above this point to activate alarm 130 through resistor 404.

Hence, as long as the voltage being delivered by the voltage divider formed by resistors 384 and 386 to line 397 and diode 394 is in the range of approximately ten volts thereby signaling a safe resistance, diode 394 turns on, thereby turning on transistor Q2 which in turn turns on transistor Q3 delivering current through resistor 392 from line 402 to activate the light-emitting diode 170. It is to be noted by reference to Table 1, that as long as the resistance back through the wrist strap is between approximately 2.5 Megohms and 200 Kilohms, the light-emitting diode 170 is turned on, and the alarm 130 is off. If the resistance is greater than approximately three Megohms signaling an increase in resistance above the predetermined resistance range, the voltage at line 397 will rise above ten volts and turn off diode 394 and transistors Q2 and Q3. Therefore, indicator 170 and alarm 130 are held in the off state. When the resistance between terminals 160 and 150 drops below 150 Kilohms signaling a decrease in resistance below the predetermined resistance range, transistors Q2 and Q3 are conducting more current, permitting the collector of transistor Q3 to rise beyond the equilibrium point, determined by the turn-on of diode 390, with some of this extra current going through diode 390, trim-potentiometer 389 and resistor 388, forming a feedback loop through resistor 384 and diode 394, back to the base of transistor Q2. This reduces the gain of amplifiers Q2 and Q3 and, therefore, requires a resistance of less than 150 Kilohms between terminals 160 and 150 for transistors Q2 and Q3 to saturate at a voltage on line 402, sufficiently large to turn on alarm 130, through resistor 404 and resistor 406, feeding current into the base of transistor Q8 and, as before, indicator 170 also remains activated. Again, when alarm 130 is activated, a signal is delivered to connector 314 for delivery over cable 230 to the central monitor 240.

Hence, transistors Q2 and Q3 function as an amplifier stage and a driver for the indicator light 170 and as a driver for alarm 130 through Q8, after diode 390 turns on and causes a reduction in gain for the amplifier consisting of Q2 and Q3. The limits for setting the voltage drop range on terminal 160, is controlled by resistors 384, 386, and 388 and trim-potentiometer 389. Again, it is to be noted that substantial sharing of the circuitry occurs with other tests, and that diode 390 functions as a level-triggered switch, which, when turned on, lowers the gain of the amplifier consisting of transistors Q2 and Q3, to discriminate narrowly between resistance values between terminals 160 and 150 of more or less than 200 Kilohms, by causing an abrupt change in the voltage level on line 402 which causes alarm 130 to turn on abruptly for resistances of less than 150 Kilohms and off for resistances greater than 200 Kilohms.

4. Conductivity Test Circuit

As previously discussed, the conductivity test functions to make surface resistance measurements on static control materials such as the conductive mat 20 on workbench 15 and the conductive floor mat 25.

The conductivity test requirements are essentially set forth in Table 2, above, and operates on the same principles and shares substantially the same circuitry as for the wrist strap test. In normal operation, terminal 188 is maintained at earth ground from line 312. Terminal 186, however, is essentially maintained at twelve volts through resistor 408 and resistor 410 which is connected over line 396 to the emitter of transistor Q1 and the base of transistor Q2. Resistor 408 limits short circuit current and resistor 410 shunts any collector-to-base leakage in transistor Q1. Terminal 186 delivers a signal through resistor 408 to line 412 into the base of transistor Q1, which is decoupled against noise through capacitor 414 to power on line 320. Capacitor 398 also decouples the base of transistor Q2, to minimize noise pick-up. In the situation where the resistance is greater than approximatly 3000 Megohms per square inch signaling less than adequate conductivity, the voltage on connector 186 is maintained at a DC level greater than ten volts and transistor Q1 does not turn on. Hence, the indicator 170 and the alarm 130 will not become activated. When this occurs, conductive materials such as conductive mat 20 or 25 are defective. On the other hand, materials having conductivity which is less than 1000 Megohms per square inch is indicated by both the visual indicator 170 and the audible alarm 130 becoming activated. In that event, ground through an adequately low resistance appears on terminal 186 signaling more than adequate conductivity and causing transistors Q1, Q2 and Q3 to activate, all of which comprises a three stage amplifier. This in turn provides power to light emitting diode 170 and to alarm 130 as previously discussed. For the situation of adequate conductivity having a predetermined conductivity range of resistance between 1000 Megohms per square inch and 3000 Megohms per square inch, transistor Q3 is not driven to a sufficiently saturated state to activate the alarm through resistor 404. Hence, only the light emitting diode 170 is activated.

5. Surface Resistance Probe

Figure 4:
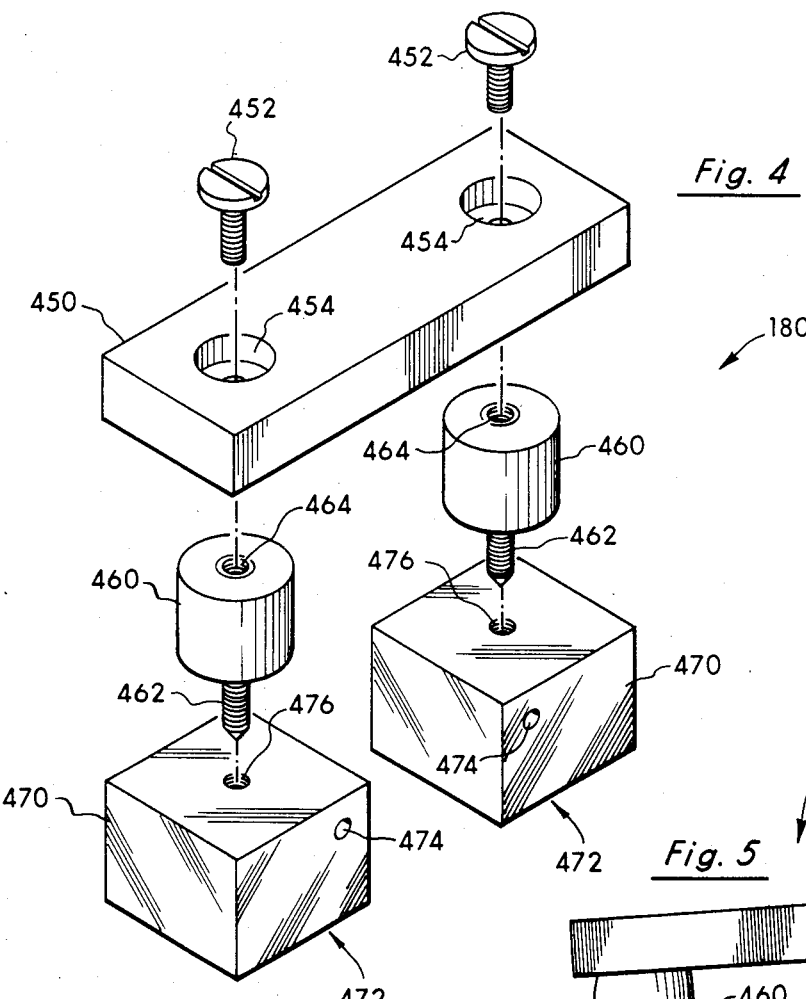
FIG. 4 is an exploded perspective view of the surface resistance probe of the present invention.

In FIG. 4 is set forth the preferred embodiment for the surface resistance probe of the present invention. The probe 180 includes a handle or bridge 450, two rubber bumpers 460, and two contact blocks 470. The handle is made from a highly insulating plastic of extremely high resistance such as more than $10^{14}$ ohms.

The contact blocks 470 are one inch square cubes that are machined from steel and coated with nickel plate. The bottom surface 472 of each cube is machined or ground flat for uniform surface contact. The cubes 470 each have a drilled hole 474 for receiving an electrical connector from cables 182 and 184. On the upper surface of the cube is a drilled hole 476 which is threaded and which is receptive of a threaded stud 462 downwardly extending from each rubber bumper 460. Each insulating bumper 460 is made from flexible rubber and the metal stud 462 is molded into the rubber bumper 460. Each rubber bumper 460 also has a threaded metal insert 464 which is molded into the rubber bumper and is receptive of bolts 452 which are passed through drilled, milled, or molded holes 454 contained within the handle 450. Note that insert 464 and threaded stud 462, contained within the rubber bumpers 460, are not in electrical or mechanical contact and permit stud 462 to flex relative to insert 464. When assembled, the bolts 452 firmly engage the threaded inserts 464 to hold the rubber bumpers 460 against the handle 450 and each rubber bumper in turn by means of its threaded stud 462 engages drilled and threaded hole 476 in each cube 470 to firmly hold each cube in position.

Figure 5:
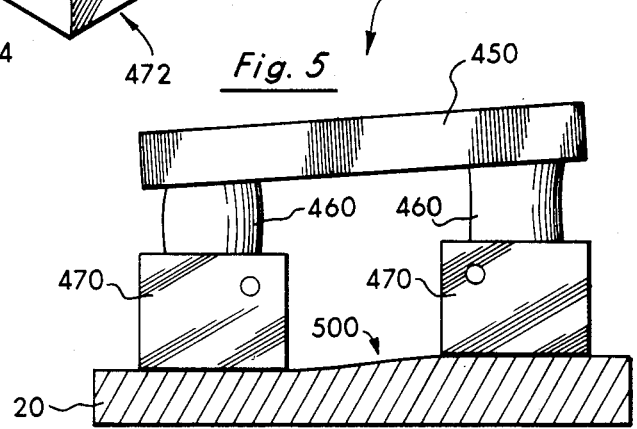
FIG. 5 is a side planar view illustration showing the application of the surface resistance probe of the present invention to an uneven surface.

This is best shown by the example set forth in FIG. 5. For example, if a conductive mat 20 contains a rise 500, because of the rubber bumpers or shock absorbers 460, the surface resistance probe 180 of the present invention is capable of firmly engaging the uneven surface 20 to make the conductivity check. The spacing between the inside surfaces of each cube 470 is exactly one inch apart, such that surface resistance "per square" is being measured. It is assumed and required that some downward pressure is exerted on handle 450, to assure good surface contact with the material being measured. Surface resistance "per square" is often specified to be measured with five pounds of pressure on the probe.

It should be expressly understood that the test values and limits set forth and described throughout this specification, are strictly choices, based on typical usage of the present invention, and that these limits and values may be changed over a wide range by changing one or more of the component values that set those values and limits. It should also be expressly noted that any diode or transistor type, or any other parts called out, may be substituted with equivalent parts without affecting the present invention. This includes the use of integrated circuits in place of discrete transistors, or part integrated circuits and part discrete transistors, without altering the functions, performance and intent of the present invention.

Although the present invention has been described with a certain degree of particularity, it is to be expressly understood that the present disclosure has been made by way of example and that changes in details of components and structure, as set forth in the preceding paragraph, may be made without departing from the spirit of the invention and as found in the following claims.

I claim:

1. An electrostatic system monitor for monitoring the operation of static control equipment located at a user's workstation, said static control equipment including (a) conductive surfaces such as a conductive workbench mat and a conductive floor mat, (b) a grounded tip soldering iron, and (c) a conductive wrist strap on the wrist of a user, said conductive surfaces and said wrist strap being connected to ground connection, said monitor and soldering iron being connected to electrical AC power having an electrical ground, said electrostatic system monitor comprising:

means connected to said ground and to said electrical ground for continuously sensing the low impedance continuity between said ground and said electrical ground, said sensing means being capable of issuing a loss-of-continuity signal in the event said low impedance exceeds a predetermined resistance value, means responsive to the manual contact with said conductive wrist strap for determining the resistance of said conductive wrist strap, said determining means being capable of producing (a) a safe resistance signal when the determined resistance is in a predetermined resistance range, (b) a loss-of-resistance signal when the determined resistance is below said predetermined resistance range, and (c) a gain-of-resistance signal when the determined resistance is above said predetermined resistance range, a surface resistance probe for detecting the surface resistance of said conductive surfaces when said probe is in contact with said surfaces, means connected to said surface resistance probe for selectively measuring the conductivity of said conductive surfaces, said measuring means being capable of generating (a) an adequate conductivity signal when the surface resistance is in a predetermined resistance range, (b) an unsafe resistance signal when the surface resistance is below said predetermined resistance range, and (c) an inadequate conductivity signal when the surface resistance is above said predetermined resistance range, and means responsive to a periodic manual contact with the tip of said soldering iron for detecting induced AC voltage, said detecting means being capable of producing an unsafe voltage signal when said induced AC voltage exceeds a preset voltage.

2. The electrostatic system monitor of claim 1 further comprising:
a first visual indicator receptive of said loss-of-continuity signal from said sensing means for indicating that the impedance between said ground and said electrical ground has exceeded said predetermined resistance value, and
an audible alarm receptive of said loss-of-continuity signal from said sensing means for audibly indicating that the impedance between said ground and said electrical ground has exceeded said predetermined resistance value.

3. The electrostatic system monitor of claim 2 wherein said predetermined resistance value is substantially 100 ohms.

4. The electrostatic system monitor of claim 2 further comprising:
a second visual indicator receptive of said safe resistance and loss-of-resistance signals from said determining means for indicating that the resistance is less than or within said predetermined resistance range, and
said audible alarm being further receptive of said loss-of-resistance signal from said determining means for indicating that the resistance is less than that of said predetermined resistance range.

5. The electrostatic monitor of claim 4 wherein said predetermined resistance range is between substantially 200 Kilohms and 2.5 Megohms.

6. The electrostatic system monitor of claim 4 further comprising:
said second visual indicator being further receptive of said adequate and unsafe resistance signals from said measuring means for indicating that the surface resistance is less than or within said predetermined conductivity range, and
said audible alarm being further receptive of said unsafe resistance signal from said measuring means for indicating that the surface resistance is less than that of said predetermined resistance range.

7. The electrostatic system monitor of claim 6 wherein said predetermined adequate conductivity range is between 10 Megohms per square inch and 3000 Megohms per square inch.

8. The electrostatic system monitor of claim 2 further comprising:
a third visual indicator receptive of said unsafe voltage signal from said detecting means for indicating that said soldering iron is not safe to use, and
said audible alarm being further receptive of said unsafe voltage signal from said detecting means for indicating that said soldering iron is not safe to use.

9. The electrostatic system monitor of claim 8 wherein said preset voltage is substantially five volts RMS.

10. The electrostatic system monitor of claim 1 wherein said detecting means comprises:
a high impedance load receptive of said induced AC voltage from said soldering iron tip,
means receptive of said AC voltage across said high impedance load for rectifying said voltage, said rectifying means being further capable of doubling said AC voltage, and
means receptive of said rectified and doubled voltage from said rectifying mean for issuing said unsafe voltage signal when said rectified and doubled voltage exceeds said preset voltage.

11. The electrostatic system monitor of claim 1 wherein said surface resistance probe comprises:
a handle made from highly insulating material,
a pair of flexible and insulating bumpers connected to the underside of said handle on opposing ends thereof, and
a pair of conductive contact blocks connected on the underside of said bumpers, said contact blocks being capable of adjusting to uneven contact surfaces on said mats by means of the flexing action of said bumpers, said bumpers further holding said contact blocks a predetermined distance apart.

12. The electrostatic system monitor of claim 1 further comprising:
means operative upon the activation of said audible alarm for generating an alarm signal, and
means located remote from said generating means and receptive of said alarm signal for monitoring when said alarm signal is generated.

13. An electrostatic system monitor for monitoring the operation of static control equipment at a user's workstation, said static control equipment including (a) conductive surfaces such as a conductive workbench mat and a conductive floor mat, (b) a grounded tip soldering iron, and (c) a conductive wrist strap on the wrist of a user, said conductive surfaces and wrist strap being connected to a ground connection, said monitor and soldering iron being connected to electrical AC power having an electrical ground, said electrostatic system monitor comprising:
means connected to said ground and to said electrical ground for continuously sensing the low impedance continuity between said ground and said electrical ground, said sensing means being capable of issuing a loss-of-continuity signal in the event said low impedance exceeds a predetermined resistance value,
a first indicator receptive of said loss-of-continuity signal from said sensing means for indicating that the impedance between said ground and said electrical ground has exceeded said predetermined resistance value,
means responsive to a manual contact with said conductive wrist strap for determining the resistance of said conductive wrist strap, said determining means being capable of producing (a) a safe resistance signal when the determined resistance is in a predetermined resistance range, (b) a loss-of-resistance signal when the determined resistance is below said predetermined resistance range, and (c)

a gain-of-resistance signal when the determined resistance is above said predetermined resistance range, a surface resistance probe for detecting the surface resistance of said conductive surfaces when said probe is in contact with said conductive surfaces, means connected to said surface resistance probe for selectively measuring the conductivity of said conductive surfaces, said measuring means being capable of generating (a) an adequate conductivity signal when the surface resistance is in a predetermined resistance range, (b) an unsafe resistance signal when the surface resistance is below said predetermined resistance range, and (c) an inadequate conductivity signal when the surface resistance is above said predetermined resistance range, a second indicator receptive of said safe resistance and loss-of-resistance signals from said determining means and of said adequate and unsafe resistance signals from said measuring means for becoming activated upon the receipt of any one of the aforesaid signals, means responsive to a manual contact with the tip of said soldering iron for detecting induced AC voltage, said detecting means being capable of producing an unsafe voltage signal when said induced AC voltage exceeds a preset voltage, a third indicator receptive of said unsafe voltage signal from said detecting means for indicating that said soldering iron is not safe to use, and an alarm receptive of (a) said loss-of-continuity signal from said sensing means, (b) said loss-of-resistance signal from said determining means, (c) said unsafe resistance signal from said measuring means, and (d) said unsafe voltage signal from said detecting means for becoming activated upon the receipt of any one of the aforesaid signals.

14. The electrostatic system monitor of claim 13 further comprising:
means operative upon the activation of said audible alarm for generating an alarm signal, and
means located remote from said generating means and receptive of said alarm signal for monitoring when said alarm signal is generated.

15. An electrostatic system monitor for monitoring the operation of static control equipment at a user's workstation, said static control equipment including (a) conductive surfaces such as a conductive workbench mat and a conductive floor mat, (b) a grounded tip soldering iron, and (c) a conductive wrist strap on the wrist of a user, said conductive surfaces and wrist strap being connected to a ground connection, said monitor and soldering iron being connected to electrical AC power having an electrical ground, said electrostatic system monitor comprising:
means connected to said ground and to said electrical ground for continuously sensing the low impedance continuity between said ground and said electrical ground, said sensing means being capable of issuing a loss-of-continuity signal in the event said low impedance exceeds a predetermined resistance value, a first indicator receptive of said loss-of-continuity signal from said sensing means for indicating that the impedance between said ground and said electrical ground has exceeded said predetermined resistance value, means responsive to a manual contact with said conductive wrist strap for determining the resistance of said conductive wrist strap, said determining means being capable of producing (a) a safe resistance signal when the determined resistance is in a predetermined resistance range, (b) a loss-of-resistance signal when the determined resistance is below said predetermined resistance range, and (c) a gain-of-resistance signal when the determined resistance is above said predetermined resistance range, a second indicator receptive of said safe resistance and loss-of-resistance signals from said determining means for becoming activated upon the receipt of any one of the aforesaid signals, means responsive to a manual contact with the tip of said soldering iron for detecting induced AC voltage, said detecting means being capable of producing an unsafe voltage signal when said induced AC voltage exceeds a preset voltage, a third indicator receptive of said unsafe voltage signal from said detecting means for indicating that said soldering iron is not safe to use, and an alarm receptive of (a) said loss-of-continuity signal from said sensing means, (b) said loss-of-resistance signal from said determining means, and (c) said unsafe voltage signal from said detecting means for becoming activated upon the receipt of any one of the aforesaid signals.

16. The electrostatic system monitor of claim 15 further comprising:
means operative upon the activation of said audible alarm for generating an alarm signal, and
means located remote from said generating means and receptive of said alarm signal for monitoring when said alarm signal is generated.

17. An electrostatic system monitor for monitoring the operation of static control equipment such as a wrist strap at a user's workstation, said static control equipment being connected to a ground connection, said monitor being connected to electrical AC power having an electrical ground, said electrostatic system monitor comprising:
means connected to said ground and to said electrical ground for continuously sensing the low impedance continuity between said ground and said electrical ground, said sensing means being capable of issuing a loss-of-continuity signal in the event said low impedance exceeds a predetermined resistance value, a first indicator receptive of said loss-of-continuity signal from said sensing means for indicating that the impedance between said ground and said electrical ground has exceeded said predetermined resistance value, means responsive to a manual contact with said static control equipment for determining the resistance of said equipment, said determining means being capable of producing (a) a safe resistance signal when the determined resistance is in a predetermined resistance range, (b) a loss-of-resistance signal when the determined resistance is below said predetermined resistance range, and (c) a gain-of-resistance signal when the determined resistance is above said predetermined resistance range, a second indicator receptive of said safe resistance and loss-of-resistance signals from said determining means for becoming activated upon the receipt of any one of the aforesaid signals, and an alarm receptive of said loss-of-continuity signal from said sensing means and said loss-of-resistance signal from said determining means, for becoming activated upon the receipt of any one of the aforesaid signals.

18. A method for monitoring the operation of static control equipment at a user's workstation, said static control equipment including (a) conductive surfaces such as a conductive workbench mat and a conductive floor mat, (b) a grounded tip soldering iron, and (c) a conductive wrist strap on the wrist of a user, said conductive surfaces and wrist strap being connected to a ground connection, said soldering iron being connected to electrical AC power having an electrical ground, said method comprising the steps of:

continuously sensing the low impedance continuity between said ground and said electrical ground, issuing a loss-of-continuity signal in the event said low impedance exceeds a predetermined resistance value, activating a first indicator in response to the issuance of a loss-of-continuity signal, periodically determining the resistance of said conductive wrist strap, producing (a) a safe resistance signal when the determined resistance of said wrist strap is in a predetermined resistance range, (b) a loss-of-resistance signal when the determined resistance of said wrist strap is below said predetermined resistance range, or (c) a gain-of-resistance signal when the determined resistance of said wrist strap is above said predetermined resistance range, periodically measuring the surface conductivity of said conductive surfaces, generating (a) an adequate conductivity signal when the surface resistance of said surfaces is in a predetermined resistance range, (b) an unsafe resistance signal when the surface resistance of said surfaces is below said predetermined resistance range, or (c) an inadequate conductivity signal when the measured surface resistance of said surfaces is above said predetermined resistance range, activating a second indicator in response to the production of said safe resistance and loss-of-resistance signals and in response to the generation of said adequate conductivity and unsafe resistance signals, periodically detecting induced AC voltage on the tip of said soldering iron, producing an unsafe voltage signal when said detected AC voltage exceeds a preset voltage, activating a third indicator in response to the production of said unsafe voltage signal, and activating an alarm in response to (a) the issuance of said loss-of-continuity signal, (b) the production of said loss-of-resistance signal, (c) the generation of said unsafe resistance signal, or (d) the production of said unsafe voltage signal.

19. The method of claim 18 further comprising the step of issuing an alarm signal to a central monitor in response to the activating of said alarm.

20. A method for monitoring the operation of static control equipment at a user's workstation, said static control equipment including (a) conductive surfaces such as a conductive workbench mat and a conductive floor mat, (b) a grounded tip soldering iron, and (c) a conductive wrist strap on the wrist of a user, said conductive surfaces and wrist strap being connected to a ground connection, said soldering iron being connected to electrical AC power having an electrical ground, said method comprising the steps of:

continuously sensing the low impedance continuity between said ground and said electrical ground, issuing a loss-of-continuity signal in the event said low impedance exceeds a predetermined resistance value, periodically determining the resistance of said conductive wrist strap, producing (a) a safe resistance signal when the determined resistance of said wrist strap is in a predetermined resistance range, (b) a loss-of-resistance signal when the determined resistance of said wrist strap is below said predetermined resistance range, or (c) a gain-of-resistance signal when the determined resistance of said wrist strap is above said predetermined resistance range, periodically measuring the surface conductivity of said conductive surfaces, generating (a) an adequate conductivity signal when the surface resistance of said surfaces is in a predetermined resistance range, (b) an unsafe resistance signal when the surface resistance of said surfaces is below said predetermined resistance range, or (c) an inadequate conductivity signal when the measured surface resistance of said surfaces is above said predetermined conductivity range, periodically detecting induced AC voltage on the tip of said soldering iron, and producing an unsafe voltage signal when said detected AC voltage exceeds a preset voltage.

21. A method for monitoring the operation of static control equipment at a user's workstation, said static control equipment being connected to a ground connection, said method comprising the steps of:

continuously sensing the low impedance continuity between said earth ground and the electrical ground found at the user's workstation, issuing a loss-of-continuity signal in the event said low impedance exceeds a predetermined resistance value, periodically determining the resistance of said static control equipment, and producing (a) a safe resistance signal when the determined resistance of said equipment is in a predetermined resistance range, (b) a loss-of-resistance signal when the determined resistance of said equipment is below said predetermined resistance range, or (c) a gain-of-resistance signal when the determined resistance of said equipment is above said predetermined resistance range.

22. The method of claim 21 further comprising the steps of:

measuring the surface conductivity of said static control equipment, and generating (a) an adequate conductivity signal when the surface resistance of said equipment is in a predetermined resistance range, (b) an unsafe resistance signal when the surface resistance of said equipment is below said predetermined resistance range, or (c) an inadequate conductivity signal when the surface resistance of said equipment is above said predetermined resistance range.

23. A method for monitoring the operation of the grounded tip soldering iron at a user's workstation, said soldering iron being connected to electrical AC power having an electrical ground, said method comprising the steps of:

detecting induced AC voltage on the tip of said soldering iron by periodically touching the tip of the soldering iron to a high impedance load, producing an unsafe voltage signal when said detected AC voltage across the high impedance load exceeds a preset voltage, and activating an indicator in response to the production of said unsafe voltage signal.

24. The method of claim 23 further comprising the steps of:

continuously sensing the low impedance continuity between said ground and said electrical ground, and issuing a loss-of-continuity signal in the event said low impedance exceeds a predetermined resistance value.

* * * * *